US009337360B1

(12) United States Patent
Wiemer et al.

(10) Patent No.: US 9,337,360 B1
(45) Date of Patent: May 10, 2016

(54) NON-ALLOYED CONTACTS FOR III-V BASED SOLAR CELLS

(75) Inventors: Michael W. Wiemer, Campbell, CA (US); Homan B. Yuen, Sunnyvale, CA (US); Vijit A. Sabnis, Cupertino, CA (US); Ting Liu, Santa Clara, CA (US); Pranob Misra, Milpitas, CA (US); Michael J. Sheldon, San Jose, CA (US); Onur Fidaner, Stanford, CA (US)

(73) Assignee: Solar Junction Corporation, San Jose, CA (US)

( * ) Notice: Subject to any disclaimer, the term of this patent is extended or adjusted under 35 U.S.C. 154(b) by 706 days.

(21) Appl. No.: 12/944,361

(22) Filed: Nov. 11, 2010

Related U.S. Application Data (60) Provisional application No. 61/261,674, filed on Nov. 16, 2009.

(51) Int. Cl.
*H01L 31/00* (2006.01)
*H01L 31/0224* (2006.01)
*H01L 31/0725* (2012.01)
*H01L 31/0735* (2012.01)

(52) U.S. Cl.
CPC *H01L 31/022425* (2013.01); *H01L 31/022433* (2013.01); *H01L 31/0725* (2013.01); *H01L 31/0735* (2013.01)

(58) Field of Classification Search
CPC ............ H01L 31/0693; H01L 31/0304; H01L 31/022491; Y02E 10/544
USPC .................................. 136/256, 255, 252, 262
See application file for complete search history.

(56) References Cited

U.S. PATENT DOCUMENTS

| 3,903,427 | A | | 9/1975 | Pack |
| 4,062,698 | A | | 12/1977 | Blakeslee et al. |
| 4,180,414 | A | | 12/1979 | Diamond et al. |
| 4,209,698 | A | | 6/1980 | Hoppe |
| 4,367,368 | A | * | 1/1983 | Wolf ............... H01L 31/022425 136/255 |
| 4,491,681 | A | | 1/1985 | Kirpich |
| 4,830,678 | A | | 5/1989 | Todorof et al. |
| 4,834,805 | A | | 5/1989 | Erbert |
| 4,999,060 | A | | 3/1991 | Szekely et al. |
| 5,118,361 | A | | 6/1992 | Fraas et al. |
| 5,460,659 | A | | 10/1995 | Krut |
| 5,500,052 | A | | 3/1996 | Horiuchi et al. |

(Continued)

FOREIGN PATENT DOCUMENTS

| EP | 2254156 A2 | 11/2010 |
| WO | 2011/137305 | 11/2011 |

(Continued)

OTHER PUBLICATIONS

Cotal et al., "III-V multijunction solar cells for concentrating photovoltaics", Energy & Environment Science, Dec. 10, 2008, pp. 174-192.*

(Continued)

*Primary Examiner* — Thanh-Truc Trinh (57) ABSTRACT

A multi junction solar cell is provided with a non-alloyed ohmic contact metallization stack by inversion of the top semiconductor layer from n-type to p-type and including the utilization of a tunnel junction. Alternatively, the non-alloyed ohmic contact can be achieved by changing the top semiconductor layer from a higher bandgap material to a lower bandgap material.

7 Claims, 4 Drawing Sheets

(56) References Cited

U.S. PATENT DOCUMENTS

| | | | |
|---|---|---|---|
| 5,935,345 A | 8/1999 | Kuznicki | |
| 5,944,913 A * | 8/1999 | Hou et al. | 136/255 |
| 6,281,426 B1 | 8/2001 | Olson et al. | |
| 6,623,283 B1 | 9/2003 | Torigian et al. | |
| 6,663,982 B1 | 12/2003 | Stephens, Jr. et al. | |
| 7,449,630 B2 * | 11/2008 | Ho et al. | 136/255 |
| 7,488,890 B2 * | 2/2009 | Takamoto | H01L 31/03046 136/255 |
| 7,514,782 B2 | 4/2009 | Hiramatsu et al. | |
| 7,727,795 B2 | 6/2010 | Stan et al. | |
| 7,851,693 B2 | 12/2010 | Fork et al. | |
| 2003/0029497 A1 | 2/2003 | Tanaka | |
| 2004/0119149 A1 | 6/2004 | Yin Pang et al. | |
| 2005/0072457 A1 | 4/2005 | Glenn | |
| 2005/0155641 A1 | 7/2005 | Fafard | |
| 2006/0162768 A1 | 7/2006 | Wanlass et al. | |
| 2006/0163596 A1 | 7/2006 | Kim et al. | |
| 2006/0185716 A1 | 8/2006 | Murozono et al. | |
| 2006/0240599 A1 | 10/2006 | Amano et al. | |
| 2007/0089774 A1 | 4/2007 | Lasich | |
| 2007/0090517 A1 | 4/2007 | Moon et al. | |
| 2007/0240760 A1 | 10/2007 | Gronet | |
| 2007/0241450 A1 | 10/2007 | Hiramatsu et al. | |
| 2007/0290287 A1 | 12/2007 | Freedman | |
| 2008/0105298 A1 | 5/2008 | Lu et al. | |
| 2008/0135088 A1 | 6/2008 | Corrales | |
| 2008/0150064 A1 | 6/2008 | Zimmerman et al. | |
| 2008/0185040 A1 | 8/2008 | Tom et al. | |
| 2008/0190480 A1 | 8/2008 | Joshi | |
| 2008/0230110 A1 | 9/2008 | Freedman | |
| 2008/0315398 A1 | 12/2008 | Lo et al. | |
| 2009/0020152 A1 | 1/2009 | Lin | |
| 2009/0064994 A1 | 3/2009 | Weatherby et al. | |
| 2009/0086478 A1 | 4/2009 | Sanroma et al. | |
| 2009/0120500 A1 | 5/2009 | Prather et al. | |
| 2009/0159126 A1 | 6/2009 | Chan | |
| 2009/0229659 A1 | 9/2009 | Wanlass et al. | |
| 2009/0255575 A1 | 10/2009 | Tischler | |
| 2009/0266395 A1 | 10/2009 | Murthy et al. | |
| 2009/0272438 A1 | 11/2009 | Cornfeld | |
| 2009/0298218 A1 | 12/2009 | Federici et al. | |
| 2010/0037935 A1 | 2/2010 | Vaid et al. | |
| 2010/0051085 A1 | 3/2010 | Weidman et al. | |
| 2010/0132765 A1 | 6/2010 | Cumpston et al. | |
| 2010/0139752 A1 | 6/2010 | Fang | |
| 2010/0180936 A1 | 7/2010 | Kim | |
| 2010/0294362 A1 | 11/2010 | Christ et al. | |
| 2010/0313954 A1 | 12/2010 | Seel et al. | |
| 2010/0326429 A1 | 12/2010 | Cumpston et al. | |
| 2010/0326492 A1 | 12/2010 | Tan et al. | |
| 2011/0030764 A1 | 2/2011 | Seo et al. | |
| 2011/0048535 A1 | 3/2011 | Nagyvary et al. | |
| 2011/0108113 A1 | 5/2011 | Arikawa | |
| 2011/0265871 A1 | 11/2011 | Lamarche | |
| 2012/0025618 A1 | 2/2012 | Erickson, Jr. et al. | |
| 2012/0199194 A1 | 8/2012 | Lamarche et al. | |
| 2012/0199195 A1 | 8/2012 | Lamarche | |
| 2012/0199196 A1 | 8/2012 | Lamarche | |

FOREIGN PATENT DOCUMENTS

| | | |
|---|---|---|
| WO | 2012/106160 | 8/2012 |
| WO | 2012/106165 | 8/2012 |

OTHER PUBLICATIONS

International Search Report and Written Opinion corresponding to the PCT application No. PCT/US10/56800, date of mailing Jan. 26, 2011, 8 pages total.

Yamaguchi et al., "*Multi-junction III-V solar cells: current status and future potential*", in: Solar Energy, vol. 79, issue 1, Jul. 2005, Abstract [online]. [Retrieved on Jan. 12, 2011 from the Internet] at URL: <http://www.sciencedirect.com/science?_ob=ArticleURL&_udi=B6V50-4DNW4BV-3&_user=10&_coverDate=07%2F31%2F2005&_rdoc=1&_fmt=high&_orig=search&_origin=search&_sort=d&_docanchor=&view=c&_searchStrId=1605061367&_rerunOrigin=scholar.google&_acct=C000050221&_version=1&_urlVersion=0&_userid=10&md5=d794dede36e6c73a9dc0c967e27d43a2&searchtype=a>.

Friedman et al., *Breakeven Criteria for the GaInNAs Junction in GaInP/GaAs/GaInNAs/Ge Four-junction Solar Cells*, pp. 331-344, Progress in Photovoltaics: Research and Applications. (2002).

Garcia et al., *Analysis of Tellurium as N-Type Dopant in GaInP: Doping, Diffusion, Memory Effect and Surfactant Properties*, pp. 794-799, Journal of Crystal Growth 298 (2007), www.sciencedirect.com Available online Dec. 4, 2006.

Geelen et al., *Epitaxial Lift-Off GaAs Solar Cell From a Reusable GaAs Substrate*, pp. 162-171, Materials Science and Engineering B45 (1997).

Green, *Do Built-in Fields Improve Solar Cell Performance?* pp. 57-66, Progress in Photovoltaics: Research and Applications (2009), Published online in Wiley InterScience (www.interscience.wiley.com) on Oct. 1, 2008.

Jackrel et al., *Dilute nitride GaInNAs and GaInNAsSb solar cells by molecular beam epitaxy*, pp. 1-8, Journal of Applied Physics 101, 114916, (2007).

Janotti et. al., *Mutual Passivation of Electrically Active and Isovalent Impurities in Dilute Nitrides*, Physical Review Letters 100, 045505 (2008).

Ng et al., *1EV $GaN_xAS_{1-x-y}SB_y$ Material for Lattice-Matched III-V Solar Cell Implementation on GAAS and GE*, pp. 76-80, (2009).

Ptak et al., *Low-acceptor-Concentration GaInNAs grown by Molecular-beam Epitaxy for High-current p-i-n. solar cell applications*, Journal of Applied Physics 98, 094501 (2005).

Volz et al., *Optimization of Annealing Conditions of (GaIn)(NAs) for Solar Cell Applications*, pp. 2222-2228, Journal of Crystal Growth 310 (2008), www.sciencedirect.com Available online Dec. 4, 2007.

Wu et al., *Band Anticrossing in Highly Mismatched III-V Semiconductor Alloys*, pp. 860-869, Semiconductor Science and Technology 17 (2002).

Yu et. al., *Mutual Passivation of Group IV Donors and Nitrogen in Diluted $GaN_xAs_{1-x}Alloys$*, pp. 2844-2846, Applied Physics Letters, vol. 83, No. 14 (Oct. 6, 2003).

International Search Report and Written Opinion corresponding to the PCT application No. PCT/US11/36486, date of mailing Aug. 25, 2011, 12 pages total.

International Search Report and Written Opinion corresponding to PCT Application No. PCT/US2012/022611, mailed on Jun. 21, 2012, 9 pages.

International Search Report and Written Opinion corresponding to PCT Application No. PCT/US2012/022539, mailed on May 23, 2012, 10 pages.

International Search Report and Written Opinion corresponding to PCT application No. PCT/US2011/034485, mailed on Aug. 3, 2011, 9 pages.

International Preliminary Report on Patentability corresponding to the PCT Application No. PCT/US2011/034485, mailed on Nov. 15, 2012, 7 pages.

Non-Final Office Action mailed on Dec. 19, 2012 for U.S. Appl. No. 13/224,204, 14 pages.

Non-Final Office Action mailed on Mar. 14, 2013 for U.S. Appl. No. 13/092,555, 12 pages.

Non-Final Office Action mailed on Dec. 11, 2013 for U.S. Appl. No. 13/092,555, 12 pages.

Non-Final Office Action mailed on Dec. 20, 2013 for U.S. Appl. No. 13/224,181, 10 pages.

Final Office Action mailed on Aug. 1, 2013 for U.S. Appl. No. 13/224,204, 15 pages.

Non-Final Office Action mailed on Mar. 14, 2013 for U.S. Appl. No. 13/224,232, 16 pages.

Final Office Action mailed on Dec. 17, 2013 for U.S. Appl. No. 13/224,232, 19 pages.

(56) References Cited

OTHER PUBLICATIONS

Notice of Allowance for U.S. Appl. No. 13/092,555, mailed on Sep. 30, 2015, 31 pages.
Notice of Allowance mailed on Jul. 8, 2014, for U.S. Appl. No. 13/224,204, 10 pages.
Final Office Action mailed Aug. 1, 2014 for U.S. Appl. No. 13/092,555, 13 pages.
Final Office Action mailed on Jul. 31, 2013 for U.S. Appl. No. 13/224,181, 14 pages.
Non-Final Office Action mailed on Jul. 7, 2014 for U.S. Appl. No. 13/224,232, 19 pages.

* cited by examiner

NON-ALLOYED CONTACTS FOR III-V BASED SOLAR CELLS

CROSS-REFERENCES TO RELATED APPLICATIONS

The present application claims benefit under 35 USC 119(e) of U.S. provisional Application No. 61/261,674, filed on Nov. 16, 2009, entitled "NON-ALLOYED CONTACTS FOR III-V BASED SOLAR CELLS," the content of which is incorporated herein by reference in its entirety.

STATEMENT AS TO RIGHTS TO INVENTIONS MADE UNDER FEDERALLY SPONSORED RESEARCH AND DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

This invention relates to structures and techniques for construction of solar cells based on III-V materials, such as gallium and arsenide. More particularly, this invention relates to the problem of forming reliable electrically conductive contacts for electrical terminals for devices or structures incorporating III-V materials.

Conventional or known III-V GaAs-based solar cells typically consist of multiple p-n junctions (sub-cells) connected in series with tunnel junctions. There are many III-V solar cell designs described in the literature. A schematic cross-sectional representation of a III-V solar cell 1 appears in FIG. 1. Most designs consist of a thin n-type emitter region on top of a thicker p-type base region (an "n-on-p" type structure), although the opposite configuration can also be employed ("p-on-n"). The designs may also include back and front surface fields around a p-n junction, in addition to tunnel junctions connecting various p-n junctions. It should be understood that within a tunnel junction are complex functional structures that are not fully described herein but which are understood by those of skill in the art.

Figure 1:
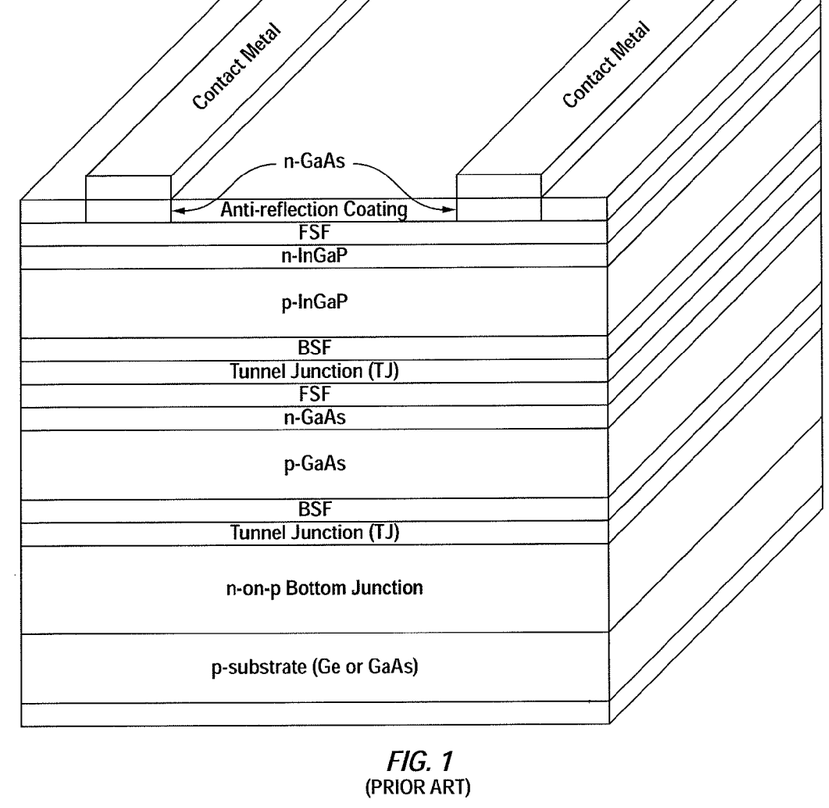
FIG. 1 is a three dimensional depiction of a prior art triple junction solar cell stack (not to scale).
Figure 2:
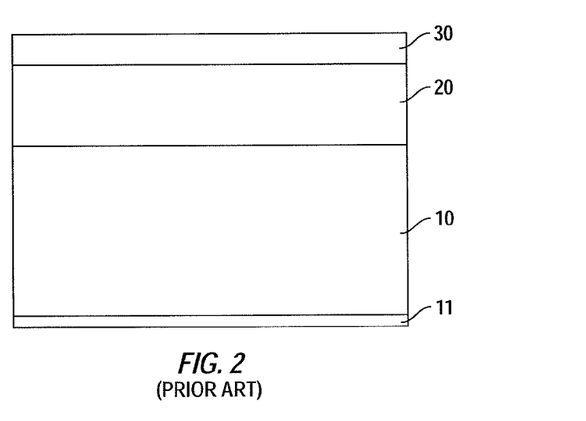
FIG. 2 is a cross-sectional diagram of a prior art solar cell for tutorial purposes.

The III-V solar cell device 1 can be divided into three parts—a lower region 10, a middle region 20, and an upper region 30, as shown in FIG. 2. The lower region 10 is a substrate on which the device layers adhere. In addition, the lower region 10 may incorporate a back or bottom contact to the substrate. The middle region 20 contains heteroepitaxial III-V device layers. The middle region 20 forms at least one p-n junction, which may either be completely contained within the middle region 20, or it may be formed between the substrate 10 and the middle region 20. In a specific proprietary embodiment, these device layers may comprise at least one dilute nitride n-on-p sub-cell. The upper region 30 may comprise the semiconductor and metal layers required to make electrical contact for the device 1, in addition to the anti-reflection coating (ARC) layers to promote solar energy absorption. (In most of the figures in this disclosure, the ARC layers are omitted for simplicity of illustration. It should be understood that such layers are present.) FIG. 1 thus shows how a typical ARC integrates into a solar cell device.

Figure 3:
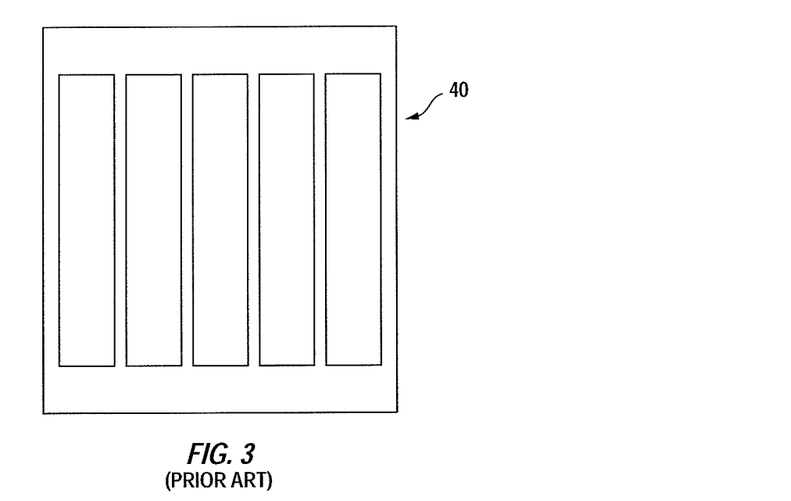
FIG. 3 is a top view schematic of a prior art metal grid layout of a solar cell (prior art).

Generally, the metal layers in the upper region 30 are patterned into a grid of lines 40, as shown in FIG. 3. The metal stack used for the grid must be sufficiently thick to conduct the solar-generated current produced by the cell with little resistance. Metal stack thicknesses on the order of 5 μm containing mostly silver or gold are known.

In some solar cells, the top grid metallization generally makes electrical contact to an n-GaAs contact layer 31. (See FIG. 4).

The Problem

The target contact resistivity for a III-V solar cell is $<10^{-4}$ ohm-cm$^2$, preferably $<10^{-5}$ ohm-cm$^2$. However, n-GaAs structures are difficult to dope sufficiently to use a non-alloyed contact and still achieve this low ohmic contact resistivity. In the past it has been thought that only non-standard dopants, such as tellurium (Te) or selenium (Se), must be used to achieve sufficiently high doping levels to reliably attain the target contact resistivity. However, these dopants pose challenges such as dopant diffusion, memory effects during material deposition, and others, and they are commonly not available on many epitaxial deposition systems in use today. (See Garcia, I. Rey-Stolle, B. Galiana, C. Algora, "*Analysis of tellurium as n-type dopant in GaInP: doping, diffusion, memory effect, and surfactant properties*," J. Crystal Growth, No. 298, 794-799, 2007.) What is needed are solutions that are workable without using either of these dopants, or having to dope the n-type GaAs contact layer at less than $10^{19}$ cm$^{-3}$.

Standard n-type dopants such as silicon cannot dope GaAs sufficiently to reliably use a non-alloyed contact metallization (maximum doping level is $5\text{-}8\times10^{18}$ cm$^{-3}$ using silicon). Instead, alloyed contact metallization schemes such as those containing AuGe are commonly used for n-GaAs contacts. The most common n-type alloyed contact metallization is a metal stack with AuGe near the semiconductor (although other schemes involving, for example, PdGe, are also used). For example, a AuGe layer or bi-layer may be substituted for layer 32 in for example FIG. 4. The AuGe based annealed contact is typically formed by annealing at between approximately 370° C. and 430° C. and poses a variety of problems for III-V solar cells, as outlined below.

The main problems with using alloyed n-type contacts for III-V solar cells are:

1.) Alloyed contacts do not adhere well to the semiconductor until after they are annealed.

Due to stress in the thick metal film stack deposited on top of the contact layers, the entire metal stack may peel off the semiconductor, limiting the thickness of metal one can apply before the contacts are annealed.

2.) The reliability of an alloyed contact may be lower than a non-alloyed contact.

An alloyed contact by definition reacts with the semiconductor, whereas a non-alloyed contact can be chosen to react minimally with the semiconductor.

3.) The alloying time and temperature can cause integration issues if there are other materials and/or structures in the device which cannot survive the thermal anneal.

This is particularly relevant for inverted processing, where the deposited semiconductor thin films on a first substrate are transferred to a second substrate. The differences in thermal expansion coefficient between this second substrate, the bond layer used to adhere the thin films to the second substrate (if any), and the transferred thin films may be such that the total stack is not capable of surviving the thermal anneal for an n-contact. (See A. van Geelen, P. R. Hageman, G. J. Bauhuis, P. C. van Rijsingen, P. Schmidt, L. J. Giling, "*Epitaxial lift-off*

*GaAs solar cell from a reusable GaAs substrate,*" Materials Sci. and Eng. No. B45, 1997, pp. 162-171.)

4.) Alloyed contacts are generally less uniform in contact resistivity than non-alloyed contacts. This non-uniformity is due to alloyed contact's propensity for local "spiking" of metal into the semiconductor. This metal spiking causes the contact resistivity to vary on a micrometer scale. This may cause reduced solar cell performance at high current levels or reliability concerns.

5.) The alloying step requires additional fabrication cycle time & equipment, increasing solar cell production costs.

For all these reasons it is evident that there is a need for a technique for making non-alloyed contacts that can be used on both sides of the III-V device without the use of Te or Se.

SUMMARY OF THE INVENTION

According to the invention, a multi junction solar cell is provided with a non-alloyed metal-semiconductor ohmic contact by forming a tunnel junction with very low resistivity on a conventional n-type layer of the solar cell. The tunnel junction may be formed in many ways but is typically formed by highly doping the n layer with a p-type material at the surface. The first metal layer on the thin layer of p-type material, which in turn is on the n-layer (thereby forming the tunnel junction) promotes adhesion of an entire non-alloyed metallization stack to the semiconductor. By non-alloyed metallization it is meant that metal does not alloy with the semiconductor.

Alternatively, the surface is prepared by laying down a very thin layer of lower-bandgap n-type material on the n-type semiconductor material of the upper-most layer, the thin layer of lower-bandgap n-type material being such that it does not contribute to the solar function. However, the presence of the lower-bandgap n-type material permits the application of a first metal layer that is responsible for lower ohmic resistance and enhanced adhesion to the semiconductor of an entire non-alloyed metallization stack. A suitable process is the incorporation of indium into a gallium arsenide crystalline structure at the surface. This specific type of operation is a known process.

In other words, the multi junction solar cell is provided with a non-alloyed ohmic contact metallization stack by first inversion of the top semiconductor layer from n-type to p-type by utilizing a tunnel junction, or alternatively by changing the top semiconductor layer from a higher bandgap material to a lower one so that non-alloyed ohmic contacts can be more readily made. The contact may be constructed without resort to tellurium or selenium. This type of construction is particularly useful in construction of a solar cell in which at least one of the absorbent layers is formed of a dilute nitride.

The invention will be better understood by reference to the following detailed description in connection with the accompanying drawings.

DETAILED DESCRIPTION OF THE INVENTION

The prior description, referencing FIGS. 1-3, is summarized hereafter and described in connection with the present invention. FIG. 1, as previously described, is cross-section of a known triple junction, n-on-p type III-V solar cell stack. The bottom p-contact is a non-alloyed type while the top n-contact may be alloyed or, according to the invention, non-alloyed, depending on the doping level of the n-GaAs contact layer. The p-substrate shown here could be part of the bottom junction or merely an electrically conductive substrate.

FIG. 2 is a cross-sectional generalization of a solar cell into lower 10, middle 20, and upper 30 regions. Element 11 is a metal layer contacting the lower region. FIG. 3 is a top view schematic of a metal grid layout 40.

Figure 4:
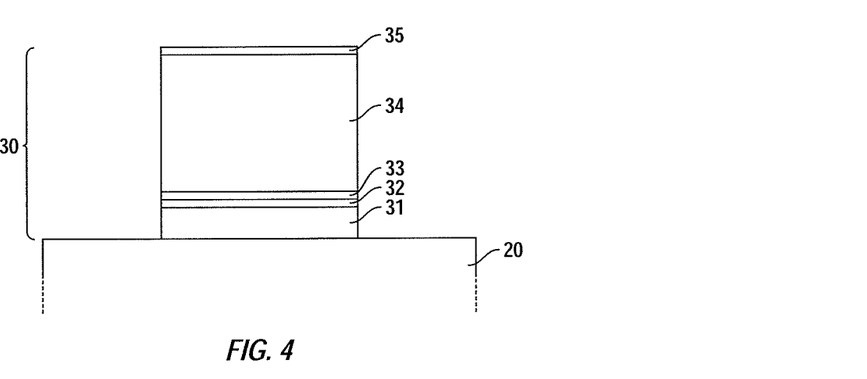
FIG. 4 is a side cross-sectional diagram of a prior arrangement of the upper part of a solar cell and can be used to illustrate the invention.

In accordance with one embodiment of the invention, FIG. 4 illustrates one possible arrangement of the upper region 30 utilizing a non-alloyed contact metal stack showing an n-GaAs layer 31, metal adhesion layer 32, metal barrier layer 33, current conduction metal layer 34 and gold cap layer 35. If this n-type GaAs contact layer is sufficiently doped (typically greater than $10^{19}$ cm$^{-3}$), a non-alloyed ohmic metal contact can be formed in accordance with the invention. A non-alloyed contact is the combination of a metal in contact with a semiconductor such that an ohmic (non-rectifying) electrical path is formed between the metal and semiconductor. A non-alloyed contact achieves this ohmic behavior without the need for a high temperature anneal step to alloy the deposited metal stack with the semiconductor. An alloyed contact is a similar arrangement of metal and semiconductor, but it requires a high temperature anneal step to alloy the semiconductor and metal or metal stack before a robust ohmic electrical path is formed.

A non-alloyed stack 30 may consist of titanium, chromium, TiW, SiW, or any other material that adheres well to the semiconductor layer 31, possibly followed by a semiconductor barrier metal layer 33 (e.g., Pt or Ni) to prevent diffusion of subsequently deposited metals into the semiconductor layer 31. Sometimes this barrier metal can also serve as the adhesive metal. In solar cells, the next metal in the stack may be, for example, a thick layer 34 of silver (Ag), possibly followed by a cap layer 35 of gold (Au). The specific metals used in the stack can vary widely and are understood by those skilled in the art. One of the advantages of a non-alloyed contact is the ability to utilize metals that adhere well to the semiconductor, reducing the probability that the metal stack will peel off the semiconductor due to the inherent stress in the metal film stack.

As further illustrated in FIG. 4, the semiconductor layers in the upper region 30 associated with the metal-semiconductor ohmic contact formation are etched away in all locations across the device, except those locations under the metal stack.

The entire metal stack in the upper region 30, including the layers that contact the semiconductor layers and the thicker current conducting layers, can be applied to the wafer by evaporation in a single deposition and subsequent liftoff step. This single evaporation approach typically results in stressed metal films that require good adhesion to the semiconductor substrate to prevent metal peeling during metal liftoff or subsequent processing. This is particularly important for the grid side of a device.

Non-alloyed metal contacts work well for p-type contacts on p-Ge and p-GaAs. For a variety of reasons, including a lower electronic metal-to-semiconductor barrier height for p-type material than n-type, and an ability to highly dope p-type material with standard dopants, non-alloyed, ohmic p-type contacts can be readily made.

Solutions for the problem target a contact resistivity of $<10^{-4}$ ohm-cm$^2$. This may be achieved as follows:

1.) Invert the Type of the Top Layer from n to p Using an Additional Tunnel Junction.

Figure 5:
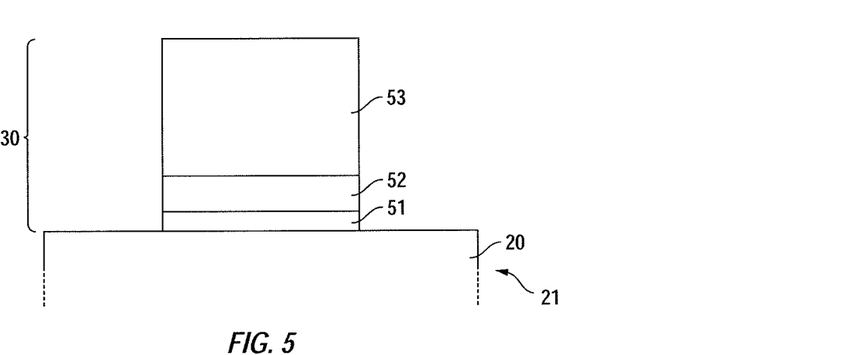
FIG. 5 is a side cross-sectional diagram of a possible arrangement of the upper region of a solar cell according to one embodiment of the invention.

As discussed above, making a non-alloyed electrical contact to p-type GaAs material is much easier than a non-alloyed contact to n-type GaAs materials. Therefore, inverting the type of doping used in the top GaAs layer from n to p makes it possible to use non-alloyed contacts without having to resort to the use of Te or Se. FIG. 5 shows a version of the upper region 30 of a solar cell where this type of inversion is achieved. The top-most semiconductor layer contained in the middle region 20 is n-type. In a specific embodiment, region 20 contains at least one n-on-p sub-cell 21 of dilute nitride. (Dilute nitrides are a class of III-V semiconductor alloys containing nitrogen in concentrations generally less than 5% and which have particularly useful bandgap characteristics.) An n-on-the-bottom, p-on-the-top tunnel junction 51 is deposited on 20, followed by a p-GaAs layer 52. The tunnel junction layer 51 may include a thin spacer layer (not shown) before the p-n junction to spatially separate the tunnel junction from the rest of the device, specifically layer 20 (refer to FIG. 2). A typical non-alloyed contact metal stack 53 follows. The tunnel junction and p-GaAs layer are etched away everywhere but under the metal layers.

Figure 9:
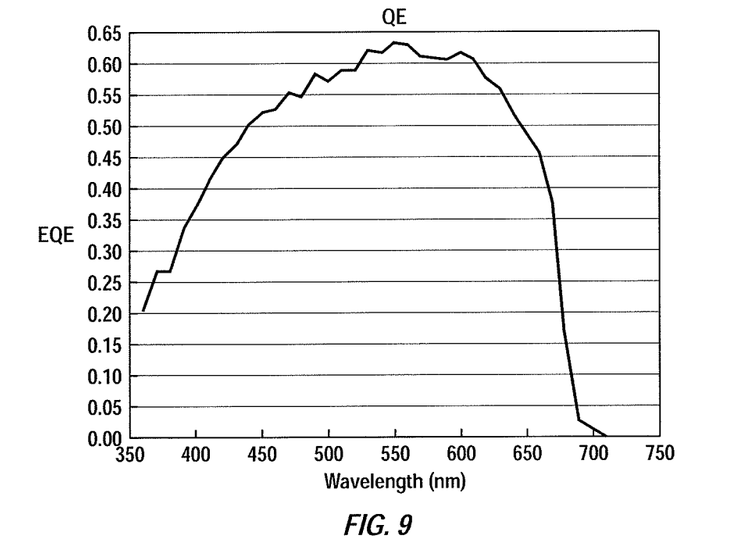
FIG. 9 is a graph illustrating External Quantum Efficiency of the InGaP junction from a two junction (InGaP/GaAs) solar cell.

A multijunction solar cell using this contact metallization approach has been built and tested. FIG. 14 shows a Quantum Efficiency (QE) plot of the top InGaP sub-cell from a double junction (InGaP/GaAs) solar cell. The contact metal stack was about 5 µm thick, demonstrating that this approach can afford thick metal contact stacks without peeling. The contact resistance for this device was $<10^{-5}$ ohm-cm$^2$.

Figure 6:
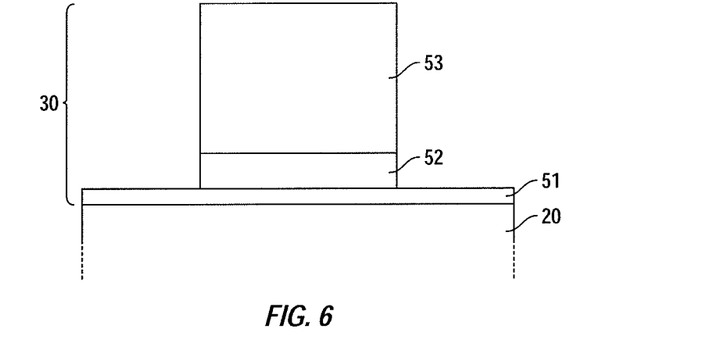
FIG. 6 is a side cross-sectional diagram of a possible arrangement of the upper region of a solar cell showing an optically transparent tunnel junction, a p-GaAs contact layer and a non-alloyed contact metal stack.

One variation on this approach, illustrated in FIG. 6, is possible if the tunnel junction 51 contained in region 30 is substantially optically transparent to the wavelengths of light absorbed by the solar cell stack contained in region 20. By substantially transparent, it is meant a transmissivity of greater than 97% of the total optical power contained in the incident optical spectrum. In this case, the tunnel junction 51 can be left as a continuous layer over the surface of the device, instead of only existing directly under the metal stack 53. Any layers which are not substantially optically transparent, such as the n-GaAs contact layer 52, must still be etched away everywhere but under the metal layers.

2.) Use a Thin, Highly Doped, Low Bandgap Layer as the Contact Layer.

Semiconductor materials having lower bandgaps can generally be doped to higher levels of dopant and have lower electronic metal-semiconductor barrier heights than larger bandgap materials. This allows non-alloyed ohmic electrical contacts to be more readily made to these lower bandgap materials. In fact, non-alloyed contact metallizations to low bandgap materials can achieve world-class low contact resistivities. For example, most Heterojunction Bi-Polar Transistors (HBTs) sold today in the Radio Frequency (RF) market have a non-alloyed contact to a non-lattice matched n-type InGaAs layer. Typically, the composition of the x in the In$_x$Ga$_{1-x}$As layer is continuously graded or stepped from GaAs (x=0) to InGaAs (x≈0.5) over approximately 50 nm, with approximately 50 nm of x≈0.5 InGaAs directly under the contact metallization stack. The final doping of the InGaAs layer near the surface is typically $>10^{19}$ cm$^{-3}$ and etched away everywhere but under the metal stack.

While the basic continuously graded-InGaAs contact layer structure described above is typical in III-V electronic devices in production today, it is not the only design commonly used. There are many design variants that can attain the same or similar contact resistivity. For instance, for all layers containing indium, which could include graded or stepped layers, the thicknesses of the InGaAs layers can be adjusted with a thickness not exceeding 500 nm but typically 50 nm-100 nm. Alternatively, a single layer of high indium content (e.g., In$_{0.5}$Ga$_{0.5}$As) can be deposited directly on the underlying semiconductor layers with no grading. Other materials instead of InGaAs may be used. Provided the contact material in question achieves a lower bandgap than GaAs, it would be a good candidate for this approach. There are many compositions, materials, gradients, and doping levels that can be used to achieve the target contact resistance of $<10^{-4}$ ohm-cm$^2$ with a non-alloyed metal-semiconductor contact.

Figure 7:
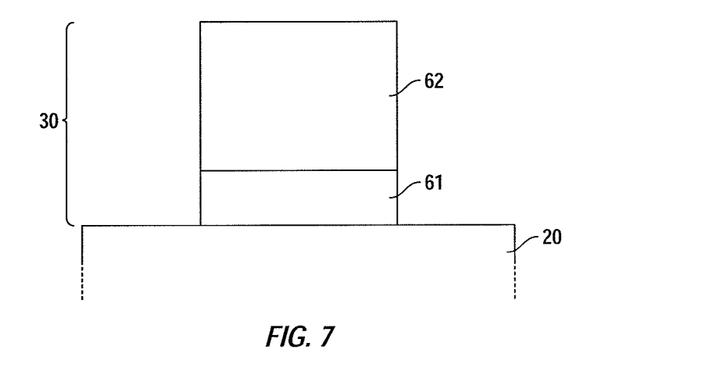
FIG. 7 is a side cross-sectional diagram of a possible arrangement of the upper region of a solar cell showing an InGaAs contact configuration.
Figure 10:
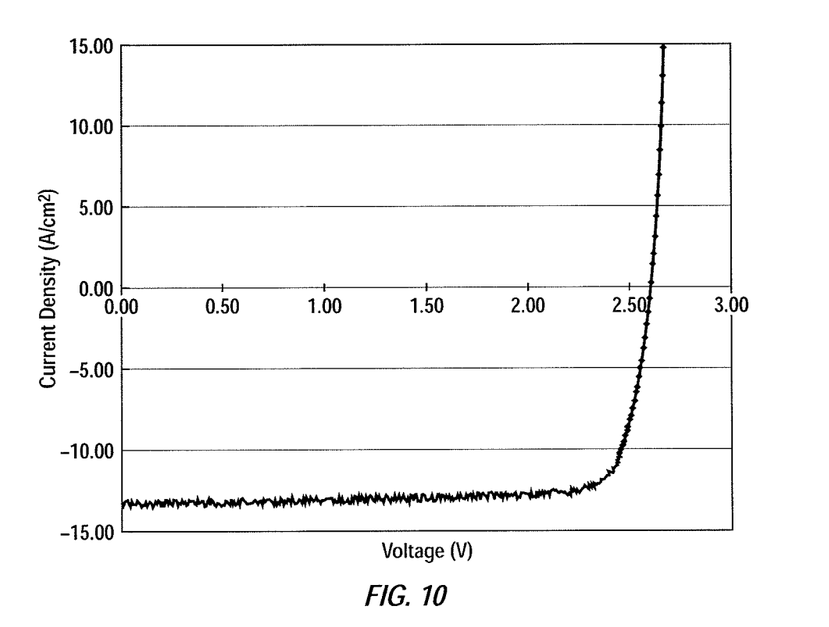
FIG. 10 is a graphical representation of current vs. voltage to illustrate solar cell performance.

A triple junction n-on-p type solar cell has been built using a non-alloyed contact 62 to a non-graded In$_{0.5}$Ga$_{0.5}$As layer 61. The InGaAs layer was doped to approximately $2\times10^{19}$ cm$^{-3}$. The contact scheme is illustrated in FIG. 7. Layer 61 is the InGaAs layer. Layer 61 can be either continuously graded, stepped, or non-graded. Layer 62 is the non-alloyed contact metallization stack. The total metal stack thickness was approximately 5 µm, demonstrating the good adhesion properties of this approach. The measured contact resistivity using the Transfer Length Method (TLM) was around $2\times10^{-7}$ to $5\times10^{-7}$ Ohm-cm$^2$. A non-alloyed metal-semiconductor contact is employed for the bottom contact to the p-GaAs substrate. Under 1-sun concentration, this device has attained solar cell efficiencies of greater than 28%, clearly demonstrating the viability of this approach. FIG. 10 shows a current-voltage curve taken on this device when illuminated with an optical spectrum close to that of the sun.

In experiments, the demonstration exceeded the contact resistivity target of $<1\times10^{-4}$ Ohm-cm$^2$. This allows for reduction of either the indium concentration of the semiconductor layer in contact with the metal stack (thereby increasing the bandgap of the InGaAs layer), decrease of the doping level of the InGaAs layer, or a combination of both. There are many combinations of doping level and composition which will achieve the target contact resistivity level.

3.) Solutions for a p-on-n Type Device

Figure 8:
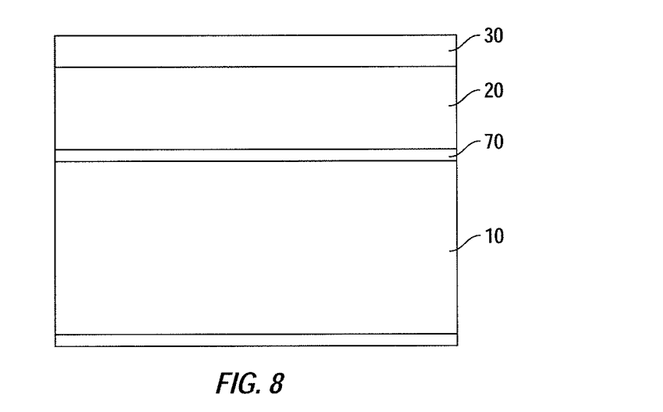
FIG. 8 is a solar cell schematic of a p-on-n type device where a tunnel junction has been provided between the lower substrate and the III-V heteroepitaxial solar cell device layers.

For a p-on-n type device, the p-contact is already on top and no type inversion of the top layer is required. However, inversion of the substrate type may be advantageous to address a number of the issues discussed above, and to avoid having to use an alloyed contact to the substrate. In this case, a tunnel junction 70 placed under the solar cell epitaxial stack between previously described region 20 and region 30 will invert the substrate type from n to p (see FIG. 8). This approach only works for those solar cells where the substrate itself is not an active solar sub-cell.

The structures described will work with many different multi junction devices having from 1-to-n junctions (where n>1). Those skilled in the art will readily understand that solutions applicable to a three junction device might also be useful for more or fewer junctions. The structures also can be used with many different materials and configurations that are used to make solar cells and sub-cells, including, without limitation, dilute nitride materials, metamorphic InGaAs layers, quantum dots, quantum wells and the like. In addition, the solutions described here can be used in solar cells where the epitaxial stack, deposited on a first substrate, is transferred to a second substrate. Thus, this disclosure is meant to be representative and illustrative, not a dispositive discussion of all the ways that those skilled in the art might use the structures.

While our preferred embodiment implements these solutions without the use of Se or Te as dopants, the solutions discussed here may include these dopants (or other nonstandard dopants) wherever they are applicable. Those skilled in the art will recognize when dopant atoms can be interchanged with the same result.

The invention has been explained with reference to specific embodiments. As noted, other embodiments may be within the contemplation of those of ordinary skill in the art. It is therefore not intended that the invention be limited, except as indicated by the appended claims.

What is claimed is:

1. A multijunction solar cell comprising a non-alloyed ohmic electrical contact, wherein the multijunction solar cell comprises:
    an n-on-p subcell comprising an uppermost n-type layer of semiconductor material;
    a p-on-n tunnel junction overlying and in contact with the n-type layer of semiconductor material;
    a p-GaAs layer overlying and in contact with the p-on-n tunnel junction; and
    a non-alloyed contact metal stack overlying and in contact with the p-GaAs layer.

2. The multijunction solar cell of claim 1, wherein a resistivity of the non-alloyed ohmic electrical contact is less than $10^{-4}$ ohms-cm$^2$.

3. The multijunction solar cell of claim 1, wherein a resistivity of the non-alloyed ohmic electrical contact is less than $10^{-5}$ ohms-cm$^2$.

4. The multijunction solar cell of claim 1, wherein the p-on-n tunnel junction transmits greater than 97% of the total optical power contained in an incident optical radiation.

5. The multijunction solar cell of claim 4, wherein the incident optical radiation passes through the p-on-n tunnel junction where a metal grid does not block the incident optical radiation from reaching the p-on-n tunnel junction.

6. The multijunction solar cell of claim 1, wherein,
    the n-on-p subcell is an n-on-p dilute nitride subcell; and
    the n-type layer of semiconductor material is an uppermost layer of the n-on-p dilute nitride subcell.

7. The multijunction solar cell of claim 1, wherein,
    the n-type layer of semiconductor material comprises a first region and a second region; and
    the p-on-n tunnel junction overlies the first region.

\* \* \* \* \*